(12) United States Patent
Kawazoe et al.

(10) Patent No.: US 7,897,976 B2
(45) Date of Patent: Mar. 1, 2011

(54) LIGHT-EMITTING DEVICE OF FIELD-EFFECT TRANSISTOR TYPE

(75) Inventors: Hiroshi Kawazoe, Kanagawa (JP); Satoshi Kobayashi, Tokyo (JP); Yuki Tani, Tokyo (JP); Hiroaki Yanagita, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/505,051

(22) PCT Filed: Feb. 18, 2003

(86) PCT No.: PCT/JP03/01716
§ 371 (c)(1), (2), (4) Date: May 13, 2005

(87) PCT Pub. No.: WO03/071608
PCT Pub. Date: Aug. 28, 2003

(65) Prior Publication Data
US 2006/0043380 A1    Mar. 2, 2006

(30) Foreign Application Priority Data
Feb. 19, 2002  (JP) ................................ 2002-042154

(51) Int. Cl.
*H01L 27/15* (2006.01)
*H01L 29/73* (2006.01)

(52) U.S. Cl. ................. 257/79; 257/78; 257/83; 257/84; 257/184; 257/187; 257/189; 257/192

(58) Field of Classification Search ............... 257/77–79, 257/52, 57, 187, 189, 192, 256, E31.004, 257/E33.004, 83, 84, 184
See application file for complete search history.

(56) References Cited

U.S. PATENT DOCUMENTS

| | | | | |
|---|---|---|---|---|
| 5,043,774 A * | 8/1991 | Shiki | ............................... | 257/99 |
| 5,523,588 A * | 6/1996 | Nishimura et al. | ............. | 257/77 |
| 5,702,643 A * | 12/1997 | Reddy et al. | ............. | 252/301.6 S |
| 6,077,458 A * | 6/2000 | Shiiki et al. | ............. | 252/301.4 R |
| 2002/0093005 A1* | 7/2002 | Sohn et al. | ................ | 252/301.16 |
| 2002/0105264 A1* | 8/2002 | Shirakawa et al. | ........... | 313/506 |

(Continued)

FOREIGN PATENT DOCUMENTS

JP    08-255924    1/1996

(Continued)

OTHER PUBLICATIONS

Hybrid Orbitals in Carbon Compounds, pp. 1-5.*

(Continued)

*Primary Examiner* — Kenneth A Parker
*Assistant Examiner* — Joseph Nguyen
(74) *Attorney, Agent, or Firm* — Antonelli, Terry, Stout & Kraus, LLP.

(57) ABSTRACT

The invention of this application is a field-effect transistor type light-emitting device having an electron injection electrode, i.e. a source electrode, a hole injection electrode, i.e. a drain electrode, an emission active member disposed between the source electrode and the drain electrode so as to contact with both electrodes, and a field application electrode, i.e. a gate electrode, for inducing electrons and holes in the emission active member, which is disposed in the vicinity of the emission active member via an electrically insulating member or an insulation gap. The emission active member is made of an inorganic semiconductor material having both an electron transporting property and a hole transporting property.

54 Claims, 1 Drawing Sheet

U.S. PATENT DOCUMENTS

2002/0153830 A1* 10/2002 Andriessen .................. 313/498

FOREIGN PATENT DOCUMENTS

WO    WO 88/02557    4/1988

OTHER PUBLICATIONS

Japanese Office Action dated Dec. 22, 2006 (with English translation).

Zhao, Hui et al., Electroluminescent Characters of ZnS :Cu, Journal of Northern Jiaotong University, Jun. 2001, pp. 67-69, vol. 25, No. 3, China Academic Journal Electronic Publishing House, Beijing, China.

Zappe, Hans P. et al., Mechanisms for the Emission of Visible Light from GaAs Field-Effect Transistors, Applied Physics Letters, Dec. 31, 1990, vol. 57, No. 27, pp. 2919-2921.

Schön, J.H., et al., A Light-Emitting Field-Effect Transistor, Science, Nov. 3, 2000, vol. 290, No. 5493, pp. 963-965.

* cited by examiner

LIGHT-EMITTING DEVICE OF FIELD-EFFECT TRANSISTOR TYPE

TECHNICAL FIELD

The present invention relates to a light-emitting device using semiconductors and, more specifically, relates to a field-effect transistor type light-emitting device.

BACKGROUND ART

Conventionally, light-emitting devices using semiconductors have been widely used for display and illumination and as light sources.

As one of such light-emitting devices, there is a light-emitting diode wherein, by applying a forward voltage to pn-junction semiconductors, electrons are injected into an n-region and holes are injected into a p-region so that light emission is achieved by recombination of electrons and holes at a junction (active region).

The pn-junction of the light-emitting diode is formed by joining together a p-type semiconductor and an n-type semiconductor each produced by doping into a semiconductor an additive that forms p-type or n-type. For example, as such a pn-junction light-emitting diode, a light-emitting diode using a diamond single crystal as an emission active material is described in Japanese Journal of Applied Physics, part 2, vol. 40, pp. L275-L278.

However, in the pn-junction light-emitting diode, it is an unavoidable problem that while sufficient light emission cannot be obtained without doping a lot of additives into semiconductor materials, there occur deformation, defect, and the like in crystal structures of the semiconductor materials due to the doping of the additives, which become quenching centers or induce light emission of unnecessary wavelengths, thereby reducing the efficiency of contribution of the injected carriers to light emission.

On the other hand, in contrast to the foregoing pn-junction light-emitting device, there is known a field-effect transistor type light-emitting device as a light-emitting device of another type using an organic substance. A field-effect transistor type light-emitting device (hereinafter A-LEFET) using α-sexithiophen is disclosed in Science Journal, vol. 290, Nov. 3, 2000, pp. 963-965.

FIG. 3 is a diagram showing a structure of a field-effect transistor type light-emitting device using α-sexithiophen.

The foregoing A-LEFET using α-sexithiophen has a structure wherein a single crystal of α-sexithiophen (hereinafter α-6T) formed by the vacuum evaporation method is used for an emission active member 21 which is sandwiched between aluminum-deposited films as a source electrode 23 and a drain electrode 24 formed with an interval of 25 μm therebetween. Further, a gate electrode 27 in the formed of an aluminum-doped zinc oxide (ZnO:Al) film is formed on the α-6T, the source electrode, and the drain electrode via aluminum oxide ($Al_2O_3$) as a gate insulating layer 26 sandwiched therebetween, thereby forming a metal/insulator/semiconductor (hereinafter MIS) type field-effect transistor (hereinafter FET) structure.

In α-6T, an intrinsic crystal thereof simultaneously has both an electron transporting property and a hole transporting property. That is, this material exhibits a so-called ambipolar conduction property by being given an injection mechanism for electrons and holes.

By applying positive potential, as compared to the potential at the source electrode as a reference, to the drain electrode and the gate electrode of the foregoing A-LEFET, electrons and holes are injected into an electron conduction level and a hole conduction level of α-6T from the source electrode and the drain electrode, respectively. These positive and negative charged carriers cause radiative recombination transition at the middle portion of a conducting channel to generate electroluminescence, thereby emitting light.

In the A-LEFET disclosed in the foregoing literature, inasmuch as the α-6T single crystal having both the hole transporting property and the electron transporting property is used for the emission active member, it is not necessary to dope into the emission active material the additives which are required for forming the pn-junction and injecting minority carriers into the light-emission region in case of the pn-junction type. Therefore, the foregoing problem of the reduction in light-emission property due to the additives is not raised.

(Problem to be Solved by the Invention)

However, there are the following problems even in the foregoing A-LEFET.

Although the single-crystal organic substance like α-6T is used for the emission active member, the mobility of electrons and the mobility of holes in the organic substance are generally small so that it is difficult to obtain a sufficient light-emission intensity. A typical numerical value of the mobility at room temperature is $10^{-3}$ to $10^{-4}$ cm$^2$/(V·s), and about $10^0$ cm$^2$/(V·s) at maximum.

In addition, it has been difficult, in the first place, to form a faultless single crystal in the organic substance, and therefore, difficult to perform efficient light emission. Further, in general, light-emitting devices are unavoidably subjected to heat generation, and there has been a problem that the A-LEFET type light-emitting device using the organic substance like α-6T is unavoidably subjected to deterioration with age in environment of use so that it is difficult to achieve a long-term reliability against deterioration.

Further, in case of the A-LEFET type light-emitting device where the emission active member is the organic substance, the spectrum of generated electroluminescence is defined, according to the light-emission mechanism, only by an energy difference between recombination levels of the emission active member into which charges can be injected from the source electrode and the drain electrode. Therefore, when α-6T is used, the emission wavelength is limited to a photon energy region of 1.6 eV or more to 2.2 eV or less (corresponding to wavelength of about 564 to 775 nm). Accordingly, in the A-LEFET type light-emitting device where the emission active member is the organic substance, the emission wavelength is determined by a substance selected for the emission active member. However, when the organic crystalline substance is used for the emission active member, it is difficult to select a substance having ambipolarity necessary for obtaining a desired wavelength, for example, light of a shorter wavelength region, and therefore, there has been a problem of poor flexibility in emission wavelength.

In view of the foregoing problems, it is an object of the present invention to provide a light-emitting device that can obtain a long-term reliability and broaden a selectivity of emission wavelength.

DISCLOSURE OF THE INVENTION (Means for Solving the Problem)

A field-effect transistor type light-emitting device according to the present invention has each of the following structures for solving the foregoing problems.

(1) A field-effect transistor type light-emitting device comprising an electron injection electrode (i.e. a source electrode), a hole injection electrode (i.e. a drain electrode), an emission active member disposed between said source electrode and said drain electrode so as to contact with said both electrodes, and a field application electrode (i.e. a gate electrode), disposed in the vicinity of said emission active member via an electrically insulating member or an insulation gap for inducing electrons and holes in said emission active member, wherein said emission active member is made of an inorganic semiconductor material having both an electron transporting property and a hole transporting property.

(2) A field-effect transistor type light-emitting device according to (1), wherein a ratio between a mobility of electrons and a mobility of holes in said inorganic semiconductor material falls within a range of 1/100 to 100.

(3) A field-effect transistor type light-emitting device according to (1), wherein a mobility of holes and a mobility of electrons at a room temperature in said inorganic semiconductor material are each $10^{-1}$ cm$^2$/Vs or more.

(4) A field-effect transistor type light-emitting device according to (1), wherein, in said inorganic semiconductor material, a carrier concentration is $10^{14}$/cm$^3$ or less, or a concentration of dopants that produce carriers is 0.1% or less.

(5) A field-effect transistor type light-emitting device according to (1), wherein said inorganic semiconductor material has a resistivity value of $10^8$ Ωcm or more.

(6) A field-effect transistor type light-emitting device according to (1), wherein said inorganic semiconductor material is a non-doped intrinsic semiconductor.

(7) A field-effect transistor type light-emitting device according to any one of (1) to (6), wherein said inorganic semiconductor material contains, as a main component, carbon forming an sp3 hybrid orbital.

(8) A field-effect transistor type light-emitting device according to any one of (1) to (7), wherein said inorganic semiconductor material is diamond.

(9) A field-effect transistor type light-emitting device according to any one of (1) to (6), wherein said inorganic semiconductor material contains a group II-VI compound, or Zn and at least one element selected from S, Se, and Te.

(10) A field-effect transistor type light-emitting device according to any one of (1) to (6), wherein said inorganic semiconductor material contains a group III-V compound, or N and at least one element selected from Al, Ga, and In.

(11) A field-effect transistor type light-emitting device according to (9), wherein said inorganic semiconductor material further contains Mn as dopants that form luminescence centers.

(12) A field-effect transistor type light-emitting device according to (9), wherein said inorganic semiconductor material further contains, as dopants that form luminescence centers, at least one element among rare earth elements, or at least one element among Tm, Tb, Pr, and Sm.

(13) A field-effect transistor type light-emitting device according to (9), wherein said inorganic semiconductor material further contains, as dopants that form luminescence centers, at least one metal element, or at least one element among Cu, Ag, Au, Al, Ga, In, Cl, F, Br, and I.

(14) A field-effect transistor type light-emitting device according to (9), wherein said inorganic semiconductor material further contains, as dopants that form luminescence centers, at least one element among Cu, Ag, and Au, and at least one element among Al, Ga, In, Cl, F, Br, and I.

BEST MODE FOR CARRYING OUT THE INVENTION (1) Structure

Figure 1:
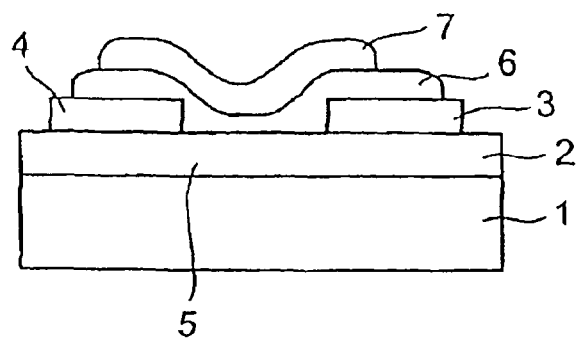
FIG. 1 is a diagram showing a structure of a field-effect transistor type light-emitting device being one embodiment according to the present invention, which comprises components including a substrate 1, an emission active member 2, a source electrode 3, a drain electrode 4, a channel portion 5, an insulating film 6, and a gate electrode 7.

FIG. 1 is a diagram showing a structure of a field-effect transistor type light-emitting device being one embodiment of the present invention.

In the light-emitting device of the present invention, an emission active member 2 is formed on a substrate 1, and a pair of a source electrode 3 and a drain electrode 4 made of conductive members and capable of injecting electrons and holes are formed at positions that sandwich a portion of the emission active member 2 therebetween.

Further, a channel portion 5 of the emission active member is formed between the pair of electrodes, and a gate electrode 7 is disposed above the channel portion 5 via an insulator 6 or an insulation air gap sandwiched therebetween for the purpose of applying an electric field for inducing electrons and holes, respectively.

Figure 2:
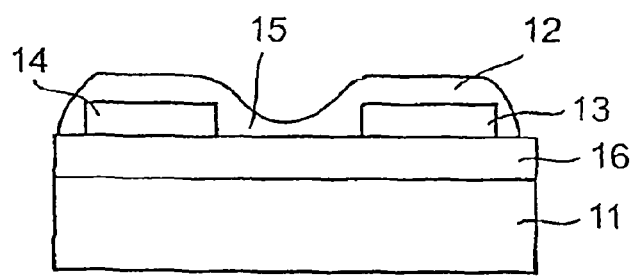
FIG. 2 is a diagram showing a structure of a field-effect transistor type light-emitting device being another embodiment according to the present invention, which comprises components including a substrate/gate electrode 11, an emission active member 12, a source electrode 13, a drain electrode 14, a channel portion 15, and an insulating film 16.
Figure 3:
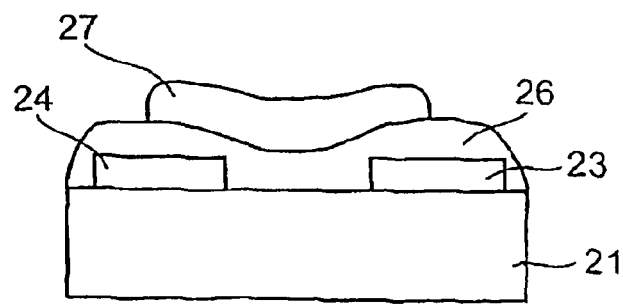
FIG. 3 is a diagram showing a structure of a field-effect transistor type light-emitting device using α-sexithiophen, which comprises components including an α-6T single crystal 21, a source electrode (Al) 23, a drain electrode (Al) 24, a gate insulating film (Al$_2$O$_3$) 26, and a gate electrode (ZnO:Al) 27.

FIG. 2 is a diagram showing a structure of a field-effect transistor type light-emitting device being another embodiment of the present invention as a modification of FIG. 1.

In FIG. 2, when a conductive substrate 11 (Si substrate, metal substrate, or the like) is used, an insulating film 16 is formed on the substrate 11, a source electrode 13 and a drain electrode 14 are formed on the insulating film, and an emission active member 12 is formed so as to contact with the source electrode 13 and the drain electrode 14. The emission active member 12 located between the source electrode 13 and the drain electrode 14 serves as a channel portion 15. The substrate 11 may be a gate electrode 17.

The emission active members 2 and 12 of the present invention are each made of an inorganic semiconductor substance having both a hole transporting property and an electron transporting property.

(2) Overall Operation

Referring to FIG. 1, the overall operation will be described hereinbelow. Note that another embodiment of FIG. 2 can also be described like FIG. 1 by changing symbols.

When positive and negative voltages, as compared to a voltage at the gate electrode as a reference, are applied to the drain electrode 4 and the source electrode 3, respectively, holes and electrons are respectively induced in the vicinity of the drain electrode and in the vicinity of the source electrode due to voltages between the gate electrode and the drain electrode and between the gate electrode and the source electrode. By a voltage applied between the source electrode 3 and the drain electrode 4, the induced electrons and holes move into the emission active member 2 and are adjusted so as to be recombined with each other at the channel portion 5.

By electroluminescence mechanism, the electrons and holes recombined at the channel portion 5 emit light having a wavelength corresponding to an energy difference between recombination levels of the material forming the emission active member 2.

(3) Details (Function, Material, Production Method, and so forth) of Respective Members ① Substrate The substrate serves as a base for the respective layers formed thereon.

When the emission active member is mainly made of carbon, use can be made of an Si substrate, a metal substrate, a glass substrate (vitreous quartz substrate, crystallized glass substrate, or the like), or the like. When the emission active member is made of Zn (S, Se, Te), use can be made of a substrate of Zn (S, Se, Te) single crystal, GaAs, InP, Si, sapphire, glass, or the like.

When the crystalline emission active member is formed above, it is preferable that lattice constants of the substrate and the formed emission active member be close to each other.

When single-crystal diamond is used as the emission active member, it is desirable that the substrate be made of single-crystal diamond in terms of consistency in lattice constant and of enabling uniform nucleation. It is desirable that a single-crystal diamond film being the emission active member be homoepitaxially grown on the substrate. It is possible to obtain an excellent (less-defect) homoepitaxially grown single-crystal diamond layer (emission active member).

② Emission Active Member

②-(i) Matters common to Various Emission Members each of an Inorganic Substance having Ambipolarity Description will be made of matters common to various emission members each made of an inorganic substance having ambipolarity.

Light emission is carried out when holes and electrons injected from the source electrode and the drain electrode are recombined together in the emission active member.

The emission active member is made of an inorganic semiconductor substance having both a hole transporting property and an electron transporting property.

It is desirable that the hole transporting property and the electron transporting property be more or less the same in degree for ensuring efficient recombination in the middle of the channel portion. Specifically, the ratio between a mobility of electrons and a mobility of holes at room temperature is preferably 1/100 to 100 and more preferably 1/10 to 10. The mobility can be measured by the normal Hall effect measurement or the time-of-flight method based on pulse light carrier excitation.

It is desirable that the mobility of holes and the mobility of electrons be both large for achieving the light-emission intensity. Specifically, the mobility at room temperature is preferably $10^{-1}$ cm$^2$/Vs or more, and more preferably 10 cm$^2$/Vs or more. When it becomes $10^{-1}$ cm$^2$/Vs or less, the flow rates of holes and electrons in the inorganic semiconductor become so small that a fully high light-emission intensity cannot be obtained.

It is desirable that a resistivity value of the emission active member itself at low temperature be large. It is ideal that an original material have no extrinsic carriers and only the carriers injected from the source electrode and the drain electrode move in the emission active member. Herein, the extrinsic carriers represent holes or electrons produced by defects or dopant ions introduced into the inorganic semiconductor forming the emission active member. Therefore, the resistivity value being large also represents a less-defect excellent-quality crystal and further represents a crystal including no dopant ions. Specifically, a DC resistivity value at room temperature is preferably $10^8$ Ωcm or more, and more preferably $10^{10}$ Ωcm or more. When the DC resistivity value becomes $10^8$ Ωcm or less, the density of carriers produced by defects or dopant ions increases while the ratio of carriers injected from the source electrode and the drain electrode relatively decreases, so that controllability as the light-emitting device is impeded.

In terms of a carrier concentration in the inorganic semiconductor, the carrier concentration is preferably $10^{16}$/cm$^3$ or less, and more preferably $10^{14}$/cm$^3$ or less. When the carrier concentration becomes $10^{16}$/cm$^3$ or more, the ratio of carriers injected from the source electrode and the drain electrode relatively decreases so that controllability as the light-emitting device is impeded. In terms of a dopant ion concentration in the inorganic semiconductor, the dopant ion concentration is preferably 0.1% or less in atomic ratio, and more preferably 1 ppm or less. When the dopant ion concentration becomes 0.1% or more, the ratio of carriers injected from the source electrode and the drain electrode relatively decreases so that controllability as the light-emitting device is impeded.

It is preferable that the concentrations of holes and electrons originally included in the emission active member itself be equal to each other. In view of this, a non-doped intrinsic semiconductor is the most desirable. As will be described later, use can be made of, apart from carbon-based or ZnS-based, SiC, another group II-VI semiconductor, a group III-V semiconductor, a semiconductor oxide such as CuInO$_2$, Si$_3$N$_4$, a semiconductor nitride such as AlN, or the like for the emission active member. Herein, the group II-VI semiconductor represents a semiconductor composed of at least one of Zn, Cd, and Hg being group IIB elements on the periodic table and at least one of O, S, Se, Te, and Po being group VIA elements, and is, for example, ZnO, ZnS, ZnSe, ZnTe, CdO, CdS, CdSe, or CdTe. Further, herein, the group III-V semiconductor represents a semiconductor composed of at least one of B, Al, Ga, In, and Tl being group IIIA elements on the periodic table and at least one of N, P, As, Sb, and Bi being group VA elements, and is, for example, AlN, AlP, AlAs, GaN, GaP, GaAs, InN, InP, or InAs.

Normally, it is sufficient if the thickness of the emission active member is fully greater than a distance provided between the source electrode and the drain electrode when the substrate used has a low resistance. This does not apply to a case where the substrate used has a high resistance, wherein several hundreds of nanometers or so is sufficient.

As the emission active member, use can be made of a crystalline or amorphous inorganic semiconductor substance. An amorphous inorganic semiconductor substance partly including a crystalline structure may also be used.

In general, the crystal as the emission active member has a merit that the mobility is high, there is less occurrence of non-radiative recombination caused by a localized level such as a bandtail, free excitons can be formed in case of diamond, and so forth.

The crystal may be a single crystal, or it may also be a polycrystal. The merit of using the single crystal is that since the impurity concentration decreases and no grain boundaries exist, a high mobility can be easily realized, a high light-emission efficiency can be easily achieved, and so forth.

The merit of using the polycrystal is that the selection width for a material of the substrate is broadened, various film forming methods can be applied, a large-area film can be obtained, and so forth.

In general, the merit of the amorphous substance as the emission active member is that the degree of freedom for selection of the substrate being the base is high, the film forming temperature is low, the degree of freedom for the composition is high, it has the isotropic physical property, and so forth.

As amorphous ambipolar substances other than carbon-based substances, there are amorphous silicon, $Si_xN_y$, amorphous germanium, SiGe, and the like.

②-(ii) Carbon-based Emission Active Member

Description will be made hereinbelow of matters peculiar to carbon-based emission members.

As the carbon-based emission active member, use can be made of a material containing, as a main component, carbon mainly forming an sp3 hybrid orbital. This is because the formation of the sp3 hybrid orbital makes it possible to obtain a semiconductor-like nature. It is possible to check whether carbon forms the sp3 hybrid orbital or to check a composition ratio thereof, by NMR or ultraviolet Raman spectroscopic analysis, or electron energy loss spectrum analysis.

It is preferable that 80 at % or more of carbon atoms form the sp3 hybrid orbital.

Further, it is preferable that the composition ratio of carbon atoms relative to all composition atoms be 90 at % or more.

The whole structure may be crystalline or amorphous, or may also be such that a crystalline structure is included in an amorphous structure.

The crystalline structure in this case is preferably a diamond-type crystal structure. Specifically, irrespective of whether the whole structure is crystalline or the crystalline structure is included in the amorphous structure, the crystalline structure preferably has the diamond-type crystal structure. As the emission active member having the diamond-type crystal, single-crystal diamond is preferable.

As the material of which the whole structure is crystalline, there can be cited a polycrystal substance of carbon having a diamond-type structure, or single-crystal diamond.

As the amorphous substance, there can be cited amorphous carbon (a-C), amorphous hydrogenated carbon (a-C:H), amorphous carbon nitride (a-$C_xN_y$), amorphous hydrogenated carbon nitride (a-$C_xN_y$:H), amorphous nitrogenated carbon (a-C:N), or amorphous carbon halide (a-C:F, a-C:Cl, or the like).

In the diamond crystal, the mobilities of electrons and holes are high and a metastable state of electrons and holes (free excitons) can be formed and, since the light-emission efficiency from these free excitons due to recombination is very high, the light emission can be efficiently carried out. The free excitons are in a metastable intermediate state while electrons are bound to holes. In the present invention, electrons injected mainly from the source electrode are bound to holes injected from the drain electrode so that free excitons in an intermediate state are formed. Since recombination of the electrons and the holes from the free excitons contributes to light emission at a very high rate, the efficient light emission can be achieved by forming the free excitons. The light emission from the free excitons corresponds to photon energy of about 5.2 eV and has a wavelength of about 238 nm.

Inasmuch as a band structure of a diamond crystal is of an indirect transition type, probability of radiative recombination between band ends thereof is small, but instead thereof, the light emission caused by the foregoing free excitons is achieved with high efficiency.

On the other hand, the merit of amorphous carbon is that because of light emission caused by direct combination between band ends, the light emission is highly efficient.

The following additional element may be added to such a carbon-based emission active member. The additional element is at least one of n-type dopants (sulfur, phosphorus, nitrogen, and the like) or p-type dopants (boron, aluminum, and the like). This is used for adjusting the mobilities of holes and electrons in the emission active member to the same level. Further, the additional element is at least one of a halogen element (chlorine, fluorine, or the like), hydrogen, and oxygen. This is used for terminating free bonds of carbon and making up for defects and the like generated at the crystal interface and the like. Oxygen is preferable in terms of insulating property.

It is preferable that the total of compositions of the elements other than carbon existing in the diamond crystal be 1 at % or less relative to the total of the numbers of atoms of all the elements excluding hydrogen. This is because, when impurities such as dopants increase, they become defects of a crystal structure to impede formation of the foregoing free excitons and work as the quenching centers, or contribute to light emission of wavelengths other than desired, thus leading to reduction in light-emission property.

In case of the emission active member having the diamond crystal, optical fundamental absorption edge energy at room temperature be 5.2 eV or more. This is because the optical fundamental absorption edge energy being less than 5.2 eV is judged to be caused by defects or disturbance of the crystal structure. That is, when there are defects or disturbance in the crystal structure, the state at band ends is localized to form a tail absorption to contribute to light absorption, thereby decreasing the optical fundamental absorption edge energy.

Note that the optical fundamental absorption edge energy is derived as photon energy where an absorption coefficient becomes $10^{-1}$/cm, in the normal light absorption spectrum measurement.

When the single-crystal diamond is used as the emission active member, light emission of a wavelength corresponding to an energy difference of 5.0 to 5.5 eV is observed according to the band structure thereof. However, when carriers are recombined via a localized level produced by defects and impurities existing in the crystal, the light-emission peak (so-called band A peak) is observed in a region of an energy difference of 2.0 to 3.5 eV.

If only the light emission corresponding to the energy difference of 5.0 to 5.5 eV is aimed at, it is desirable that the light-emission peak in the region of 2.0 to 3.5 eV be small. In the cathode luminescence spectrum obtained by irradiating an electron beam of 5 kV at room temperature, the light-emission peak intensity exhibited in the energy region of 5.0 to 5.5 eV is preferably one time or greater than the light-emission peak intensity exhibited in the energy region of 2.0 to 3.5 eV, and more preferably eight times or greater.

When the diamond crystal is used for the emission active member, the energy difference between recombination levels due to direct recombination between band ends is 5.5 eV and corresponds to ultraviolet light having a wavelength of about 225 nm. Further, when the diamond crystal is used for the emission active member, although the foregoing metastable state of electrons and holes (free excitons) can be formed, light emission from these free excitons corresponds to an energy difference of about 5.2 eV slightly smaller than the energy level difference between the band ends and has a wavelength of about 238 nm.

When the amorphous carbon-based substance is used for the emission member, it is possible to emit visible light having a wavelength of about 400 to 600 nm. Specifically, in case of typical tetrahedral amorphous carbon (ta-C), the energy difference between recombination levels is about 2.5 eV which corresponds to a wavelength of about 500 nm.

The single-crystal diamond can be formed by the plasma chemical vapor deposition method (hereinafter, the plasma CVD method), the flame deposition method, the hot filament CVD method, the high-pressure/high-temperature synthetic method, or the like, using the single-crystal diamond substrate.

The polycrystalline substance of the diamond-type crystal can be formed by a method wherein nucleation is carried out on the substrate of Si or the like, and deposition is carried out thereon by the plasma CVD method.

Amorphous carbon can be formed by the plasma CVD method, the ion beam deposition method, the cathodic arc deposition method, or the like.

In order to cause amorphous carbon to include a crystal, the hydrogen concentration in a material gas is decreased or the temperature of the substrate is dropped in a later-described plasma CVD method for diamond film formation.

In recent years, attention has been paid to short-wavelength light sources following high densification of recording media. The light-emitting device using the carbon-based substance that can emit ultraviolet light can also be used as such a recording light source. Further, by introducing light into a phosphor from the light-emitting device, it can also be used as a light source that produces light of a desired wavelength such as white light.

②-(iii) ZnS-based Emission Active Member

Description will be made hereinbelow of matters peculiar to ZnS-based emission active members.

The ZnS-based emission active member is a substance containing Zn and at least one element selected from S, Se, and Te. Specifically, there can be cited ZnS, ZnSe, ZnTe, $ZnS_xSe_{(1-x)}$ (0<x<1), and the like. Each of these substances has a high melting point, is stable at room temperature, and does not change in quality even when subjected to irradiation of sunlight, and therefore, it gives a high reliability to the light-emitting device of the present invention.

The ZnS-based emission active member may be amorphous but, in terms of the light-emission efficiency, it is preferably crystalline. The crystal structure determines a band structure of the emission active member and further determines the light-emission wavelength and the light-emission efficiency, and therefore, it is an important factor. A crystal of ZnS, ZnSe, or ZnTe has a crystal structure of a ZnS type (β-ZnS structure, Zinc Blend structure) or a wurtzite type (α-ZnS structure), and either crystal structure can be used for the emission member of the present invention. The ZnS-type crystal structure can be said to be a structure wherein eight vacancies tetrahedrally disposed in a unit lattice of a cubic closest packing structure are partly filled with atoms. Specifically, the ZnS-type crystal structure is a structure wherein atoms of one element occupy positions of corners and face centers of a unit lattice and atoms of the other element occupy sites tetrahedrally disposed like in a diamond structure. On the other hand, the wurtzite-type crystal structure can be expressed as a structure wherein Zn atoms and S atoms are overlapped at positions of atoms of a unit lattice in a hexagonal closest packing structure, then those S atoms are moved vertically by ⅜ of a side of the unit lattice. (written by F. S. Garasso, translated by Seiki Kato and Keizo Uematsu, Graphical Fine Ceramics Crystal Chemistry, 2nd edition, 1987, Agne Gijutsu Center).

(i) ZnS

ZnS has the wurtzite-type crystal structure besides the ZnS-type crystal structure, wherein the ZnS-type is a low-temperature phase and is subjected to transition to the wurtzite-type at 1,020° C. ZnS has a forbidden band width of 3.7 eV. Since energy of 3.7 eV corresponds to a light wavelength of 335 nm, ZnS can be used for emitting ultraviolet light, visible light, or infrared light each having a wavelength of 335 nm or more. Further, ZnS is a direct-transition type semiconductor, which is a factor for a high light-emission efficiency. That is, when comparing light-emission coefficients of recombination of electrons and holes between the direct-transition type and the indirect-transition type, the coefficient of the direct type is greater by four figures or so. Since the light emission is caused by direct recombination of electrons and holes existing at band ends of ZnS, ultraviolet light with a wavelength around 335 nm is emitted with a high light-emission efficiency by irradiation of light, electron beam impact, current injection, or the like.

ZnS is one of the most important substances in terms of use as a phosphor, and has been widely used as phosphors for cathode-ray tubes. In the cathode-ray tube, an electron beam is irradiated to ZnS to produce holes of a valence band and electrons of a conduction band so as to utilize light emitted upon recombination thereof. ZnS is one of substances of which the recombination light-emission efficiency upon excitation by electron-impact excitation or light excitation is the highest among all the inorganic substances.

Since the irradiation of electron beam requires the vacuum system such as the cathode-ray tube, it is preferable that a solid light-emitting device be realized. However, a light-emitting diode (LED) using ZnS has not been realized. This is because, since there exists no technique for injecting holes into a valence band of ZnS, p-ZnS has not been realized and therefore a pn-junction using ZnS has not been realized. For this reason, in a current-injection type light-emitting device using ZnS, holes are injected via a Schottky barrier (MES device), by tunnel emission (field emission)(MIS device), or from an interface level. Therefore, a fully large current can not be injected at a low voltage suitable for practical use so that the light-emitting device using ZnS has not been widespread in society.

In the field-effect transistor type light-emitting device of the present invention, a pn-junction is not used and therefore p-ZnS is not required so that the technique of doping holes into ZnS is not a necessary technique. In the present invention, the p-electrode and the n-electrode in ohmic contact therebetween are brought into contact with the ZnS layer being the emission active member so that holes and electrons are efficiently injected into the ZnS layer, and therefore, a sufficiently large current can be caused to flow at a low voltage suitable for practical use, thereby capable of realizing a highly practical solid light-emitting device.

Note that using n-ZnS as part of the n-electrode for its layer contacting with the ZnS layer is very effective for realizing an ohmic contact to ZnS. Further, if a metal film of In, an In-Ga alloy, or the like with a low work function is formed on n-ZnS and an annealing process is applied thereto, an excellent nonrectifying junction can be realized to contribute to improvement in light-emission efficiency.

When dopants are introduced into the emission active member of the present invention as luminescence centers, light emission is not caused by direct recombination of electrons and holes existing at band edges, but is caused by transition via a level of the dopants. Also in this case, since the level of the dopants is achieved by addition of a perturbation to a conduction band or a valence band, the nature thereof is similar to that of the conduction band or the valence band, and therefore, the recombination coefficient becomes similar to that in case of the direct recombination between the band edges (edited by Phosphor Academy, Phosphor Handbook, 1987, Ohmsha, Ltd. pp. 144). That is, even when the dopants are introduced as the luminescence centers, the recombination light-emission coefficient is increased by four figures or so by using the direct-transition type semiconductor.

Although the crystalline property of the ZnS layer tends to be lowered due to the dopants being the luminescence centers and thus the light-emission efficiency tends to be lowered, a function can be given of emitting light having a wavelength other than one that is determined by a band gap. That is, when Ag and Cl are both introduced into ZnS (ZnS:Ag,Cl), the light-emitting device of the present invention emits blue light, while, when Cu and Al are both introduced into ZnS (ZnS:Cu,Al), the light-emitting device of the present invention emits green light. Depending on the target light-emission wavelength, proper dopants are selected.

(ii) ZnSe

ZnSe is a direct-transition type wide-gap semiconductor having the ZnS-type crystal structure and having a forbidden band gap of 2.8 eV. ZnSe has semiconductor properties that are better than those of ZnS and ZnTe. The forbidden band gap is smaller than ZnS. Since energy of 2.8 eV corresponds to a light wavelength of 440 nm, it can be used for emitting visible light or infrared light each having a wavelength longer than 440 nm. Since ZnSe is the direct-transition type semiconductor like ZnS, the recombination light-emission coefficient is large. Since the light emission is caused by direct recombination of electrons and holes existing at band edges of ZnSe, the light-emitting device of the present invention emits blue light with a wavelength around 440 nm.

Since ZnSe can be subjected to n-type and p-type doping, not only a pn-junction can be produced, but also light-emitting devices such as a light-emitting diode and a laser diode have been reported. The light-emitting diode using a pn-junction of ZnSe is excellent in light-emission property and a luminous efficiency of 8 lm/w has been realized (Kanji Bando et al., Applied Physics, vol. 71, pp. 1518, 2002).

p-ZnSe is realized by introducing Li or N as an acceptor into ZnSe. Particularly, N is effective as an acceptor for producing high-concentration holes so that a hole density of about $1 \times 10^{18}/cm^3$ can be achieved with excellent reproducibility (S. W. Lim et al., Applied Physics Letters, vol. 65 (1994) page 2437). However, the carrier density of p-ZnSe is not sufficiently high for producing a nonrectifying junction between it and a substrate of metal such as Au, and therefore, a substance such as p-ZnTe or p-HgTe is sandwiched as a contact layer between p-ZnSe and a substrate of metal such as Au or Pt to thereby manage to provide nonrectification. However, a heterojunction between ZnSe and ZnTe or HgTe is not easy due to a difference in lattice constant so that it is necessary to sandwich several buffer layers for matching the lattice constants, which makes a diode structure much complicated.

Further, the ZnSe-based light-emitting device is short in life duration and thus has not been put to practical use. The reason for this is considered such that defects existing in a ZnSe crystal due to n-type and p-type doping and so forth are increased during application of an electric field and come to work as quenching centers.

In the field-effect transistor type light-emitting device of the present invention, since a pn-junction is not used, p-ZnSe and n-ZnSe are components that are not necessary. It is sufficient to bring the p-electrode and the n-electrode in ohmic contact therebetween into contact with the ZnSe layer being the emission active member and to inject holes and electrons into the ZnSe layer. To this end, the substrate material can be widely selected and the device structure can be simplified.

Further, since ZnSe being the emission active member does not contain either p-type or n-type dopants, deterioration of the crystalline property due to the dopants does not occur, the defect density is low, and an increase in defect density due to application of the electric field is not liable to occur, so that a long device duration can be realized.

Note that using p-ZnSe as part of the p-electrode for its layer contacting with the ZnSe layer or using n-ZnSe as part of the n-electrode for its layer contacting with the ZnSe layer is highly effective for realizing an ohmic contact to ZnSe being the emission active member and contributes to improvement in light-emission efficiency.

When dopants are introduced as luminescence centers, light emission is caused by transition via a level of the dopants. Although the crystalline property of the ZnSe layer tends to be lowered due to the dopants being the luminescence centers and thus the light-emission efficiency tends to be lowered, a function can be given of emitting light having a wavelength other than one that is determined by a band gap. Depending on the target light-emission wavelength, proper dopants are selected.

(iii) ZnTe

ZnTe is a direct-transition type wide-gap semiconductor having the ZnS-type crystal structure or the wurtzite-type crystal structure and having a forbidden band gap of 2.4 eV. ZnTe has semiconductor properties that are better than those of ZnS and ZnSe. The forbidden band gap is smaller than ZnSe. Since energy of 2.3 eV corresponds to a light wavelength of 520 nm, it can be used for emitting visible light or infrared light each having a wavelength longer than 520 nm. Since ZnTe is the direct-transition type semiconductor like ZnS, the recombination light-emission coefficient is large. Since the light emission is caused by direct recombination of electrons and holes existing at band edges of ZnTe, the light-emitting device of the present invention emits green light with a wavelength around 520 nm.

p-type doping is relatively easy to ZnTe as opposed to ZnS or ZnSe so that a hole density of $1 \times 10^{19}/cm^3$ can be realized. However, since it is difficult to realize n-ZnTe, a report about a light-emitting device using a pn-junction has not been found.

In the field-effect transistor type light-emitting device of the present invention, since a pn-junction is not used, p-ZnTe and n-ZnTe are components that are not necessary. The light-emitting device can be realized by bringing the p-electrode in ohmic contact into contact with the ZnTe layer being the emission active member and by injecting holes into the ZnTe layer from the p-electrode.

Note that using p-ZnTe as part of the p-electrode for its layer contacting with the ZnTe layer being the emission active member is highly effective for realizing an ohmic contact to ZnTe being the emission active member and contributes to improvement in light-emission efficiency.

When dopants are introduced as luminescence centers, light emission is caused by transition via a level of the dopants. Although the crystalline property of the ZnSe layer tends to be lowered due to the dopants being the luminescence centers and thus the light-emission efficiency tends to be lowered, a function can be given of emitting light having a wavelength other than one that is determined by a band gap. Depending on the target light-emission wavelength, proper dopants are selected.

(iv) Solid Solution

ZnS, ZnSe, and ZnTe have the same crystal structure and are mutually solid soluble over the whole regions so that solid solutions such as $ZnS_xSe_{(1-x)}$, $ZnS_yTe_{(1-y)}$, and the like can be produced and used as the emission active members of the present invention. Following substitution of S→Se→Te, a band gap is narrowed so that light emission with a longer wavelength is made possible. An energy difference of 3.7 eV at band gap corresponds to a wavelength of 335 nm in case of ZnS, that of 2.8 eV corresponds to a wavelength of 440 nm in case of ZnSe, and that of 2.4 eV corresponds to a wavelength of 520 nm in case of ZnTe.

It is possible to substitute Cd, Mg, Ca, Sr, Ba, or the like for part of Zn. For example, $Zn_xCd_{(1-x)}S$, $Zn_xMg_{(1-x)}Se$, $Zn_xCa_{(1-x)}Te$, $Zn_xCd_{(1-x)}Se_yS_{(1-y)}$, or the like can be used as the emission active member. In this case, replaced Zn is up to about 10% of Zn. Since a band gap can be broadened or narrowed by replacing part of Zn, the light-emission wavelength can be adjusted. Further, if a quantum wall or a quantum dot is produced by a substituted crystal and introduced into the ZnS-based emission member, it effectively functions as a luminescence center. It is also effective to use the substituted crystal as the emission member and introduce thereinto ZnS, ZnSe, or ZnTe as a quantum well or a quantum dot. That is, for example, $Zn_xCa_{(1-x)}Se_yS_{(1-y)}$ may be used as the emission active member and $Zn_xCd_{(1-x)}Te$ may be used as the luminescence center, or $Zn_xMg_{(1-x)}Se_yS_{(1-y)}$ may be used as the emission active member and $Zn_xCd_{(1-x)}Se_yTe_{(1-y)}$ m may be used as the luminescence center. It is effective to select them so that a band gap of the luminescence center becomes narrower than a band gap of the emission active member.

By doping additives into these ZnS-based substances, it is possible to achieve light emission with various wavelengths due to levels formed by the additives. As the additives, metal elements and halogen elements can be cited. For example, by addition of both group I (Cu, Ag, Au) and group II (Al, Ga, In, Cl, F, Br, I), light emission of blue-green-red can be achieved by properly selecting concentrations of both of group I and group II. This is because an element of group I forms an acceptor level and an element of group II forms a donor level, and a pair of these donor and acceptor become a luminescence center. Orange light emission can be achieved by adding Mn. As addable dopants other than the foregoing, there can be cited rare earth elements, for example, Tm (blue), Tb (green), Pr (white), Sm (red), and the like. However, in this case, the addition is carried out in the form of trivalent fluoride (LnF3) for charge compensation.

The additive is normally added at a concentration of 5 mol % or less.

Also in case where the additive is added, the light-emission wavelength tends to be longer following the substitution of S→Se→Te. Depending on selection of a basic Zn-based substance and selection of an additive, it is possible to make a design that can achieve a desired light-emission wavelength.

The substance containing Zn and S, Se, or Te can be produced by evaporation, sublimation, the MOCVD method, the MBE method, or the like.

When the material containing Zn and S, Se, or Te is used for the emission active member, it is possible to emit visible light of about 400 to 800 nm by selecting additional metal.

The foregoing light emission is useful for display and illumination.

③ Source Electrode, Drain Electrode

The source electrode and the drain electrode respectively inject electrons and holes into the emission active member when applied with a voltage between the electrodes. Selection is made of a substance that does not cause a barrier relative to a material forming the emission active member and thus enables an ohmic contact therewith.

④ Insulator

The insulator is formed for keeping insulation between the gate electrode and the emission active member. Formation is made of an insulating metal oxide such as tantalum oxide ($Ta_2O_5$), silicon oxide ($SiO_x$), zirconium oxide ($ZrO_2$), or aluminum oxide ($Al_2O_3$), or an insulating metal nitride such as $Si_3N_4$, or an air gap may be provided.

⑤ Gate Electrode

The gate electrode, when applied with a voltage thereto, makes an adjustment so that electrons and holes injected into the emission active member are recombined in the middle of the channel portion. More specifically, the voltage applied between the source electrode and the drain electrode and the voltage applied to the gate electrode are adjusted so that electrons injected from the source electrode and holes injected from the drain electrode are recombined near the middle of the channel portion.

For the gate electrode, a conductive substance such as metal is used. When Si, metal, or the like is used for the substrate, this may be used as the gate electrode so as to form the device as shown in FIG. 2.

(4) Definition and so Forth

Shown physical property values are values at a temperature in use. Generally, it is a room temperature. Specifically, the values are at 300K. Taking heat generation of the light-emitting device also into account, it is more preferable to be within the range of the shown physical property values at 300 to 400K.

(5) EXAMPLES

Hereinbelow, the embodiment will be described in further detail by showing concrete examples. However, the scope of claim for patent is not limited to those examples.

Example 1

Example of Diamond Single Crystal

As the substrate shown in FIG. 1, preparation was made of a high-pressure/high-temperature synthetic Ib type diamond single crystal having a plate-like shape with the surface being a square with a side of 2 mm and with a thickness of 0.2 mm.

The surface of the diamond substrate was formed by mechanically surface-polishing a {100} facet of the diamond crystal. The misorientation angle thereof was 0.5°. This crystal diamond substrate was subjected to ultrasonic washing using isopropanol and acetone in order, then immersed into a chromic acid solution with simultaneous application of ultrasonic wave, then further subjected to a so-called RCA washing process to remove adsorbed substances.

Then, an undoped homoepitaxial diamond film was formed on the diamond substrate as the emission activated member by the use of the microwave plasma chemical vapor deposition (hereinafter, MW-PCVD) method. The washed diamond substrate was attached to a substrate holder with a heater provided in a film forming chamber of a microwave plasma chemical vapor deposition (hereinafter, MW-PCVD) apparatus, and super-high evacuation (background pressure: $5 \times 10^{-6}$ Pa) was carried out. The substrate holder was heated to a constant temperature by the resistance heating type heater, and a microwave at a frequency of 2.5 GHz was introduced into the film forming chamber under the condition where the diamond substrate placed on the substrate holder was thermally equilibrated with the set temperature of the substrate heater, to produce material gas plasma to thereby form the homoepitaxial undoped diamond crystal film on the substrate.

The material gas was a mixture gas obtained by diluting high-purity methane ($CH_4$) by high-purity hydrogen ($H_2$), the concentration of methane was 3 mol % (sample #1), 1 mol % (sample #2), and 0.2 mol % (sample #3), the total flow rate of the material gas was 100 sccm, the material gas pressure in the film forming chamber was 30 Torr, the input microwave power was 1 kW, and the substrate temperature was 900° C. The formed diamond crystal films each had a {100} facet as the surface of growth and the thickness was 10 μm.

In the diamond crystal films of samples #1, #2, and #3, the ratios of elements other than carbon were 120 ppm, 70 ppm, and 30 ppm, respectively, and carbon atoms forming an sp3 hybrid orbital were approximately 100% in carbon elements in each of the samples.

Then, as a pair of a source electrode and a drain electrode, formation was made of plate-like titanium (Ti) thin films each having square front and back surfaces with a side of 0.5 mm and having a thickness of 100 nm, on each of the homoepitaxial diamond single-crystal films.

These Ti thin film electrodes were formed by high-frequency sputtering using high-purity Ti as a target in an atmosphere of pure argon (Ar), and the typical surface roughness thereof is Ra=10 nm. A sputtering apparatus used here is a high-frequency sputtering apparatus using normal parallel flat-plate electrodes and having a structure wherein a substrate is disposed on the side of a ground electrode and a metal target is disposed on the side of a confronting electrode applied with high-frequency power at a frequency of 13.56 MHz via a blocking capacitor. After the formation of the Ti thin films on the diamond crystal film, the shape of the source electrode and the drain electrode was formed by a sequence of general photolithography processes including application of a photoresist, exposure and development of a photomask pattern, etching of an unnecessary portion of the Ti film, and plasma ashing of the photoresist. An interval between the source electrode and the drain electrode, i.e. the channel length, was set to 5 μm.

Thereafter, each of the diamond crystal films formed thereon with the source electrode and the drain electrode was subjected to an annealing process in an argon gas atmosphere under normal pressure at a temperature of 400° C. for 15 hours so as to form a titanium carbide layer between the source and drain electrodes and the diamond crystal film, thereby forming an ohmic contact interface.

Thereafter, again, ultrasonic washing using isopropanol and acetone was carried out in order.

Then, stoichiometric tantalum oxide ($Ta_2O_5$) as a gate insulating film was formed on the diamond single crystal and the source and drain electrodes by the high-frequency sputtering method. Tantalum oxide used in this example was deposited by high-frequency sputtering a high-purity metal tantalum target in an atmosphere of a mixture gas of argon (Ar) and oxygen ($O_2$). During the film formation, the total gas flow rate and partial pressures of argon and oxygen were respectively 100 sccm, 8 mTorr, and 2 mTorr, and the input high-frequency power density and the substrate temperature were respectively 1.2 W/cm$^2$ and a room temperature. Further, the thickness of tantalum oxide was 40 nm.

Then, a gate electrode was formed on the gate insulating film by depositing a metal (Au) thin film according to the normal vacuum deposition method. The film thickness was 200 nm. The size of the gate electrode was set to a length and a wide each of 0.5 mm for covering all the channel portion so that an electron hole recombination region could be formed near the middle between the source and drain electrodes when a desired electric field was applied to the respective electrodes.

In this manner, the field-effect transistor type light-emitting devices in this example were obtained.

In this example, the emission active member was formed by the plasma chemical vapor deposition method using the microwave. However, it can be replaced with one that produces plasma using a high-frequency plasma reactor of an electron cyclotron resonance (ECR) type, a capacitive coupling type, or an inductive coupling type. As the material gas, use was made of the mixture gas of methane and hydrogen when forming the emission active member. However, organic molecules for a material gas can also be obtained by vaporizing, other than methane, general hydrocarbon or an organic substance composed of oxygen, carbon, and hydrogen. Further, the substrate heating technique may also be, other than the resistance heating type, high-frequency induction heating, infrared-ray irradiation, or a lamp heating type.

Further, as the gate insulating film, use can also be made of, other than tantalum oxide, metal oxide such as silicon oxide ($SiO_x$) or zirconium oxide ($ZrO_2$), or an air gap.

Then, lead wires and a power source were connected to the source electrode, the drain electrode, and the gate electrode, respectively, and the voltage was applied thereto. The source electrode potential was set to the reference potential, i.e. 0V, and the drain electrode potential and the gate electrode potential were set to positive values. When the gate potential is kept constant at +10V or higher, while increasing the drain potential, current flowing into the drain electrode, i.e. a drain current value, is saturated to an approximately constant value in a high potential region, so that a so-called drift speed saturation effect of carriers is exhibited. When the gate voltage was set to +10V, a pinchoff drain voltage was +7V.

As shown in Table 2, the mobilities of electrons and holes in the deposited crystal diamond had similar values, i.e. $1\times10^3$ to $2\times10^3$ cm$^2$/V·s, so that the positive and negative carrier densities in the high-quality diamond crystal as an intrinsic semiconductor were approximately equal to each other. Further, since the Fermi level is located in substantially the middle of a forbidden band, when a voltage in a range of +17 to +23 which are about twice a gate voltage of +10V, is applied to the drain electrode, electrons and holes are injected from the source electrode and the drain electrode into a light-emission active region at a middle portion of the diamond film. In this event, respective space-charge regions of electrons and holes are formed so as to divide the channel into two parts, and therefore, recombination transition of the carriers efficiently occur in the middle thereof.

On the other hand, since the band structure of the diamond crystal is of the indirect-transition type, the radiative recombination probability between band ends thereof is small. However, since bound energy of free excitons that can exist in the excellent-quality diamond crystal has a large value of 80 meV, electron-hole pairs captured as the free excitons produce radiative transition upon collapse even at normal temperature and thus can emit energy corresponding to a difference between the forbidden band width of the diamond and the bound energy of the free excitons, i.e. energy of 5.2 eV, as photons to the outside.

Based on the foregoing idea, +10V as the gate voltage and +20V as the drain voltage were applied to the field-effect transistor type light-emitting devices obtained in this example, then light emission was observed at 5.2 eV (wavelength: about 238 nm) from samples #1, #2, and #3.

Further, in the field-effect transistor type structure shown in this example, it has been understood that the gate voltage is selectable within a range of +8V to +16V and, by applying a drain voltage of about twice the gate voltage, equivalent positive and negative carriers can be injected and a light-emission recombination region can be formed at a middle portion of the channel. Accordingly, it has been understood that ultraviolet electroluminescence from the free excitons can be achieved by the present field-effect transistor type structure having the high-quality diamond emission active region.

The mobilities of electrons and holes at room temperature in the diamond thin films respectively used as the emission active members of samples #1, #2, and #3 and the ratios thereof are as shown in Table 1, respectively.

TABLE 1

| Sample | Electron Mobility ($cm^2/V \cdot s$) | Hole Mobility ($cm^2/V \cdot s$) | Electron Mobility/ Hole Mobility |
|---|---|---|---|
| #1 | $1.6 \times 10^3$ | $1.0 \times 10^3$ | 1.6 |
| #2 | $1.8 \times 10^3$ | $1.5 \times 10^3$ | 1.2 |
| #3 | $2.0 \times 10^3$ | $2.0 \times 10^3$ | 1.0 |

Further, DC resistivity values ($\rho(\Omega \cdot cm)$), optical fundamental absorption edge energy values ($\epsilon_g(eV)$), and values (CL peak intensity ratio) of (peak intensity of light-emission peak exhibited in energy region of 5.0 to 5.5 eV)/(peak intensity of light-emission peak exhibited in energy region of 2.0 to 3.5 eV) in the cathode luminescence spectrum obtained at room temperature by irradiating an electron beam accelerated by a static voltage of 5 kV, at room temperature in the diamond thin films respectively used as the emission active members of samples #1, #2, and #3 are as shown in Table 2.

Further, in the state where +10V was applied, as a gate voltage that can prevent dielectric breakdown and simultaneously obtain a sufficient electric field strength, to the tantalum oxide sputtered film having a thickness of 40 nm to thereby obtain a strong saturation drain current, when a drain voltage of +20V was applied, light emission was observed at 5.2 eV (wavelength: about 238 nm) from samples #1, #2, and #3, and simultaneously, in the electroluminescence spectrum of each sample, a wideband peak located in the vicinity of 2.5 eV (wavelength: about 496 nm; corresponding to light emission caused by defect or the like), i.e. a so-called band A peak, was exhibited, while a narrow-band peak was exhibited in the vicinity of 5.2 eV (wavelength: about 238 nm; corresponding to light emission caused by free excitons). The peak intensity ratio, i.e. (peak intensity at 5.2 eV)/(peak intensity at 2.5 eV) (EL peak intensity ratio), is as shown in Table 2.

TABLE 2

| Sample | $\rho(\Omega \cdot cm)$ | $\epsilon_g(eV)$ | CL Peak Intensity Ratio | EL Peak Intensity Ratio |
|---|---|---|---|---|
| #1 | $2 \times 10^8$ | 4.3 | $4.5 \times 10^{-2}$ | $1.2 \times 10^{-2}$ |
| #2 | $5 \times 10^{10}$ | 4.7 | $1.3 \times 10^{-1}$ | $3.3 \times 10^{-2}$ |
| #3 | $1 \times 10^{12}$ | 5.2 | $8.0 \times 10^0$ | $5.0 \times 10^0$ |

From Table 2, it has been understood that when comparing sample #3, sample #2, and sample #1, the resistivity values and the optical fundamental absorption edge energy values are larger in the order named, and that, as observed in the cathode luminescence spectrum, the free exciton peak intensity is high while the density of defects or impurities is low in the diamond crystal as the deposited emission active member. Particularly, with respect to sample #3, it has been understood that it is possible to efficiently achieve light emission with a wavelength of about 238 nm in an ultraviolet region.

Example 2

Example of Amorphous Carbon

Preparation was made of a substrate made of synthetic quartz glass and having a square shape with a side of 2 mm and a thickness of 0.2 mm. The substrate surface was mechanically surface-polished, and the average roughness was Ra=5 nm. An RCA washing process like in Example 1 was applied to the substrate to thereby remove adsorbed substances.

Then, an undoped amorphous carbon hydride (a-C:H) layer was formed as an emission active member on the substrate by the plasma chemical vapor deposition (hereinafter, rf-PCVD) method. The washed quartz substrate was attached to a conductive substrate holder provided in a film forming chamber of an rf-PCVD apparatus, and super-high evacuation (background pressure: $8 \times 10^{-6}$ Pa) was carried out. This rf-PCVD apparatus has a structure wherein a high frequency of 13.56 MHz produced from an oscillator is inputted via an impedance matching device into one end of a helical antenna with a pitch of 1.5 cm and 5 turns wound on the outer periphery of a quart-tube plasma reactor, to thereby form a material gas in a case into plasma. Further, the substrate holder is connected to a high-frequency power source via a blocking capacitor and the impedance matching device so that the substrate holder and the surface of the substrate can produce a negative DC self-bias ($V_{dc}$) relative to the plasma produced by operation of the plasma reactor, depending on the input high-frequency power and the plasma density.

The synthetic quartz substrate was kept at normal temperature, the high-frequency power was inputted into the helical antenna and the substrate holder, and a methane gas was introduced into the film forming chamber, to thereby form the undoped a-C:H film. High-purity (99.9999%) methane ($CH_4$) gas was used as the material gas, the total flow rate of the material gas was set to 100 sccm, and the material gas pressure in the film forming chamber was set to 0.1 Torr. The high-frequency power fed to the helical antenna was set to 100 W, and the high-frequency power fed to the substrate holder was set to 150 W. In this event, the DC self-bias produced on the substrate surface was −120V.

In this manner, the a-C:H film was formed on the substrate into a thickness of 1 µm.

As the plasma producing mechanism, the capacitive-coupling type high-frequency plasma reactor was used. However, it can be replaced with a microwave plasma reactor or an electron cyclotron resonance (ECR) type reactor. Further, a material gas can also be obtained by vaporizing, other than high-purity methane ($CH_4$), high-purity ethylene ($C_2H_5$), general hydrocarbon, or an organic substance composed of oxygen, carbon, and hydrogen.

In the formed a-C:H layer, the composition ratio of carbon atoms was 97%, and 83% of them formed an sp3 hybrid orbital.

Further, at room temperature, the mobility of holes was $2 \times 10^{-1}$ $cm^2/V \cdot s$, the mobility of electrons was $1 \times 10^0$ $cm^2/V \cdot s$, and the ratio in mobility between holes and electrons was 0.2. Further, at room temperature, the DC resistivity value and the optical fundamental absorption edge energy value were $1 \times 10^{10}$ $\Omega cm$ and 2.5 eV.

Then, like in Example 1, a pair of a source electrode and a drain electrode were formed on the amorphous carbon layer. In order to obtain an ohmic contact between the respective electrodes and the amorphous carbon layer, a graphitic a-C:H layer was formed between a-C:H and the Ti electrodes.

Then, like in Example 1, a $Ta_2O_5$ film being an insulator was formed so as to cover the middle of the amorphous carbon layer serving as a channel portion and upper portions of the respective electrodes.

Further, like in Example 1, an Au thin film was deposited as a gate electrode in a region on the insulator corresponding to a position above the channel portion.

In this manner, a field-effect transistor type light-emitting device in this example was obtained.

Lead wires and a power source were connected to the source electrode, the drain electrode, and the gate electrode, respectively, and the voltage was applied thereto. The source electrode potential was set to the reference potential, i.e. 0V, and the drain electrode potential and the gate electrode potential were set to positive values. When a voltage of 8V was applied to the gate electrode and a voltage of 16V was applied to the drain electrode, broad light emission having a peak at 2.0 eV (corresponding to a wavelength of about 620 nm) was obtained at the channel portion in substantially the middle of the amorphous carbon layer.

Example 3

Example of ZnS:Cu,Al

On an Si (p-type; resistivity: 8 Ωcm) substrate having a size of 15×15 mm and a thickness of 650 μm and having on the surface thereof a thermally oxidized film of 200 nm as an insulator, a source electrode and a drain electrode each having a size of 1 mm×2 mm and a thickness of 80 nm were disposed at an interval of 20 μm therebetween (with sides of 2 mm facing each other) by the high-frequency sputtering method using Au as an electrode material.

Further, ZnS:Cu,Al as an emission active member was stacked thereon by electron-beam deposition. The film formation was carried out at a substrate heating temperature of 250° C. by the use of a ZnS pellet having a Cu concentration of about 0.1 mol % and an Al concentration of about 0.3 mol %, respectively, as a deposition source. The film thickness was set to 500 nm. The formed film contained 0.08 mol % of Cu and 0.26 mol % of Al.

In the formed ZnS:Cu,Al layer, the mobility of electrons was 12 $cm^2/V \cdot s$, the mobility of holes was 0.4 $cm^2/V \cdot s$, and the ratio between the mobility of electrons and the mobility of holes was 30. Further, the resistivity was 5×10$^8$ Ωcm. Then, using Si of the substrate as a gate electrode, lead wires and a power source were connected to the respective electrodes to thereby obtain a field-effect transistor type light-emitting device in this example shown in FIG. 2.

Using the source potential as a reference, a gate potential of 10V and a drain voltage of +30V were applied, so that green light emission having a peak at 535 nm was observed.

Example 4

Example of ZnS:Mn$^{2+}$

On a substrate, a source electrode, and a drain electrode which were the same as those in Example 3, ZnS:Mn$^{2+}$ was stacked by electron-beam deposition like in Example 3. A ZnS pellet having an Mn$^{2+}$ concentration of 0.2 mol % was used as a deposition source. The film thickness was set to 300 nm. The formed film contained 0.21 mol % of Mn.

In the formed ZnS:Mn$^{2+}$ layer, the mobility of electrons was 10 $cm^2/V \cdot s$, the mobility of holes was 0.15 $cm^2/V \cdot s$, and the ratio in mobility between electrons and holes was 67. Further, the resistivity was 1×10$^9$ Ωcm.

Then, using Si of the substrate as a gate electrode, lead wires and a power source were connected to the respective electrodes to thereby obtain a field-effect transistor type light-emitting device in this example shown in FIG. 2.

Using the source potential as a reference, a gate potential of 20V and a drain voltage of +50V were applied, so that orange light emission having a peak at 590 nm was observed.

Example 5

Example of ZnS:Cu,Al

On a substrate, a source electrode, and a drain electrode which were the same as those in Example 3, $ZnS_{0.8}Se_{0.2}$:Cu, Al was stacked by electron-beam deposition like in Example 3. A pellet having Cu and Al concentrations of 0.2 mol % and 0.5 mol %, respectively, was used as a deposition source. The film thickness was set to 400 nm. The formed film was $ZnS_{0.8}Se_{0.2}$:Cu,Al and contained 0.12 mol % of Cu and 0.40 mol % of Al. In the formed $ZnS_{0.8}Se_{0.2}$:Cu,Al layer, the mobility of electrons was 25 $cm^2/V \cdot s$, the mobility of holes was 1.1 $cm^2/V \cdot s$, and the ratio in mobility between electrons and holes was 23. Further, the resistivity was 2×10$^8$ Ωcm. Then, using Si of the substrate as a gate electrode, lead wires and a power source were connected to the respective electrodes to thereby obtain a field-effect transistor type light-emitting device in this example shown in FIG. 2.

Using the source potential as a reference, a gate potential of 15V and a drain voltage of +20V were applied, so that yellow-orange light emission having a peak at 560 nm was observed.

Example 6

Example of ZnS:Ag

On a {100} facet of a semi-insulating GaAs substrate (resistivity: 3×10$^7$ Ωcm) having 10 mm×10 mm and a thickness of 625 μm, ZnS:Ag being an emission active member was deposited in the following manner. The substrate was subjected to organic washing and then placed (position A) in a tube furnace (tube diameter: 35 mm). 1 g of ZnS powder mixed with 0.2 mol % of Ag powder was used as a feed material, and this feed material was put into an open container made of silica glass which was then placed (position B) in the tube furnace. Then, both ends of the tube furnace were hermetically sealed by a flange. The temperatures at the positions A and B were kept at 950° C. and 600° C., respectively. During heating, a nitrogen-diluted 3.5% $H_2$ gas was caused to flow at a flow rate of 200 cc/min in a direction from the position B toward the position A using a gas introduction port provided in the flange in advance. The heating was carried out for one hour, then the furnace was dropped in temperature to a room temperature. A ZnS:Ag film was deposited in a thickness of 600 nm on the substrate. The content of Ag was about 0.02 mol %. In the formed ZnS:Ag layer, the mobility of electrons was 40 $cm^2/V \cdot s$, the mobility of holes was 3 $cm^2/V \cdot s$, and the ratio in mobility between electrons and holes was 13. Further, the resistivity was 1×10$^9$ Ωcm.

On this ZnS:Ag, a source electrode and a drain electrode each having 5 mm×2 mm and a thickness of 100 nm were disposed at an interval of 50 μm therebetween (with sides of 5 mm facing each other) by the vacuum evaporation method using In as an electrode material. Further, an $Al_2O_3$ gate film as an insulator was formed so as to cover a channel portion by the electron-beam deposition method using $Al_2O_3$ as a deposition source. Further, on the gate film formed to cover the channel portion, a gate electrode having a size of 5×2 mm and a thickness of 100 nm was formed by the high-frequency sputtering method using Pt as an electrode material. Lead wires and a power source were connected to the respective electrodes to thereby obtain a field-effect transistor type light-emitting device in this example shown in FIG. 1.

Using the source potential as a reference, a gate potential of 5V and a drain voltage of +8V were applied, so that blue light emission having a peak at 460 nm was observed.

(Effect of the Invention)

As described above, according to the present invention, there is provided a field-effect transistor type light-emitting device comprising an electron injection electrode, i.e. a source electrode, a hole injection electrode, i.e. a drain electrode, an emission active member disposed between said source electrode and said drain electrode so as to contact with said both electrodes, and a field application electrode, i.e. a gate electrode, disposed in the vicinity of said emission active member via an electrically insulating member or an insulation gap for inducing electrons and holes in said emission active member, said field-effect transistor type light-emitting device characterized in that said emission active member is made of an inorganic semiconductor material having both an electron transporting property and a hole transporting property. Therefore, addition of dopants for the purpose of a pn-control is not required so that it is possible to provide a field-effect light-emitting device that is not subjected to reduction in light-emission efficiency caused by dopants, that can achieve a long-term reliability, and that can broaden a selectivity of light-emission wavelength. That is, according to the present invention, since an inorganic semiconductor material is used, the crystal growth with a low defect density is enabled so that not only the efficient light emission can be carried out, but also the long-term reliability can be achieved. Further, since diamond, a group II-VI compound semiconductor, a group III-V compound semiconductor, or the like can be used as the inorganic semiconductor, the mobility is large so that not only a sufficient light-emission intensity can be achieved, but also the light-emission wavelength can be selected over the wide range from ultraviolet light to infrared light. Further, by adding dopants that form luminescence centers, the selection of light-emission wavelength is further broadened.

INDUSTRIAL APPLICABILITY

To provide a field-effect transistor type light-emitting device that can obtain a long-term reliability and broaden a selectivity of light-emission wavelength.

The invention claimed is:

1. A field-effect transistor type light-emitting device comprising:
   an electron injection electrode, i.e. a source electrode;
   a hole injection electrode, i.e. a drain electrode;
   an emission active member disposed between said source electrode and said drain electrode so as to contact with said both electrodes to form a channel in said emission active member between said both electrodes; and
   a field application electrode, i.e. a gate electrode, disposed in the vicinity of said emission active member via an electrically insulating member or an insulation gap for inducing electrons and holes in said channel of said emission active member,
   said field-effect transistor type light-emitting device characterized in that
   said emission active member is made of a non-doped or donor, acceptor-codoped inorganic semiconductor material having both an electron transporting property and a hole transporting property so that the induced electrons and holes move into said emission active member and are recombined with each other in said channel thereby to emit light,
   wherein a ratio between a mobility of electrons and a mobility of holes in said inorganic semiconductor material falls within a range of 1/100 to 100, and
   wherein a carrier concentration in said inorganic semiconductor material is $10^{14}/cm^3$ or less.

2. A field-effect transistor type light-emitting device according to claim 1, characterized in that a mobility of holes and a mobility of electrons at a room temperature in said inorganic semiconductor material are each $10^{-1} cm^2/Vs$ or more.

3. A field-effect transistor type light-emitting device according to claim 2, characterized in that said inorganic semiconductor material contains, as a main component, carbon forming an sp3 hybrid orbital.

4. A field-effect transistor type light-emitting device according to claim 2, characterized in that said inorganic semiconductor material is diamond.

5. A field-effect transistor type light-emitting device according to claim 2, characterized in that said inorganic semiconductor material contains a group II-VI compound, or Zn and at least one element selected from S, Se, and Te.

6. A field-effect transistor type light-emitting device according to claim 5, characterized in that said inorganic semiconductor material further contains Mn as dopants that form luminescence centers.

7. A field-effect transistor type light-emitting device according to claim 5, characterized in that said inorganic semiconductor material further contains, as dopants that form luminescence centers, at least one element among rare earth elements, or at least one element among Tm, Tb, Pr, and Sm.

8. A field-effect transistor type light-emitting device according to claim 5, characterized in that said inorganic semiconductor material further contains, as dopants that form luminescence centers, at least one metal element, or at least one element among Cu, Ag, Au, Al, Ga, In, Cl, F, Br, and I.

9. A field-effect transistor type light-emitting device according to claim 5, characterized in that said inorganic semiconductor material further contains, as dopants that form luminescence centers, at least one element among Cu, Ag, and Au, and at least one element among Al, Ga, In, Cl, F, Br, and I.

10. A field-effect transistor type light-emitting device according to claim 2, characterized in that said inorganic semiconductor material contains a group III-V compound, or N and at least one element selected from Al, Ga, and In.

11. A field-effect transistor type light-emitting device according to claim 1, characterized in that, in said inorganic semiconductor material, a concentration of dopants that produce carriers is 0.1% or less.

12. A field-effect transistor type light-emitting device according to claim 11, characterized in that said inorganic semiconductor material contains, as a main component, carbon forming an sp3 hybrid orbital.

13. A field-effect transistor type light-emitting device according to claim 11, characterized in that said inorganic semiconductor material is diamond.

14. A field-effect transistor type light-emitting device according to claim 11, characterized in that said inorganic semiconductor material contains a group II-VI compound, or Zn and at least one element selected from S, Se, and Te.

15. A field-effect transistor type light-emitting device according to claim 14, characterized in that said inorganic semiconductor material further contains Mn as dopants that form luminescence centers.

16. A field-effect transistor type light-emitting device according to claim 14, characterized in that said inorganic semiconductor material further contains, as dopants that form luminescence centers, at least one element among rare earth elements, or at least one element among Tm, Tb, Pr, and Sm.

17. A field-effect transistor type light-emitting device according to claim 14, characterized in that said inorganic semiconductor material further contains, as dopants that form luminescence centers, at least one metal element, or at least one element among Cu, Ag, Au, Al, Ga, In, Cl, F, Br, and I.

18. A field-effect transistor type light-emitting device according to claim 14, characterized in that said inorganic semiconductor material further contains, as dopants that form luminescence centers, at least one element among Cu, Ag, and Au, and at least one element among Al, Ga, In, Cl, F, Br, and I.

19. A field-effect transistor type light-emitting device according to claim 11, characterized in that said inorganic semiconductor material contains a group III-V compound, or N and at least one element selected from Al, Ga, and In.

20. A field-effect transistor type light-emitting device according to claim 1, characterized in that said inorganic semiconductor material has a resistivity value of $10^8$ Ωcm or more.

21. A field-effect transistor type light-emitting device according to claim 20, characterized in that said inorganic semiconductor material contains, as a main component, carbon forming an sp3 hybrid orbital.

22. A field-effect transistor type light-emitting device according to claim 20, characterized in that said inorganic semiconductor material is diamond.

23. A field-effect transistor type light-emitting device according to claim 20, characterized in that said inorganic semiconductor material contains a group II-VI compound, or Zn and at least one element selected from S, Se, and Te.

24. A field-effect transistor type light-emitting device according to claim 23, characterized in that said inorganic semiconductor material further contains Mn as dopants that form luminescence centers.

25. A field-effect transistor type light-emitting device according to claim 23, characterized in that said inorganic semiconductor material further contains, as dopants that form luminescence centers, at least one element among rare earth elements, or at least one element among Tm, Tb, Pr, and Sm.

26. A field-effect transistor type light-emitting device according to claim 23, characterized in that said inorganic semiconductor material further contains, as dopants that form luminescence centers, at least one metal element, or at least one element among Cu, Ag, Au, Al, Ga, In, Cl, F, Br, and I.

27. A field-effect transistor type light-emitting device according to claim 23, characterized in that said inorganic semiconductor material further contains, as dopants that form luminescence centers, at least one element among Cu, Ag, and Au, and at least one element among Al, Ga, In, Cl, F, Br, and I.

28. A field-effect transistor type light-emitting device according to claim 20, characterized in that said inorganic semiconductor material contains a group III-V compound, or N and at least one element selected from Al, Ga, and In.

29. A field-effect transistor type light-emitting device according to claim 1, characterized in that said inorganic semiconductor material is a non-doped intrinsic semiconductor.

30. A field-effect transistor type light-emitting device according to claim 29, characterized in that said inorganic semiconductor material contains, as a main component, carbon forming an sp3 hybrid orbital.

31. A field-effect transistor type light-emitting device according to claim 29, characterized in that said inorganic semiconductor material is diamond.

32. A field-effect transistor type light-emitting device according to claim 29, characterized in that said inorganic semiconductor material contains a group II-VI compound, or Zn and at least one element selected from S, Se, and Te.

33. A field-effect transistor type light-emitting device according to claim 32, characterized in that said inorganic semiconductor material further contains Mn as dopants that form luminescence centers.

34. A field-effect transistor type light-emitting device according to claim 32, characterized in that said inorganic semiconductor material further contains, as dopants that form luminescence centers, at least one element among rare earth elements, or at least one element among Tm, Tb, Pr, and Sm.

35. A field-effect transistor type light-emitting device according to claim 32, characterized in that said inorganic semiconductor material further contains, as dopants that form luminescence centers, at least one metal element, or at least one element among Cu, Ag, Au, Al, Ga, In, Cl, F, Br, and I.

36. A field-effect transistor type light-emitting device according to claim 32, characterized in that said inorganic semiconductor material further contains, as dopants that form luminescence centers, at least one element among Cu, Ag, and Au, and at least one element among Al, Ga, In, Cl, F, Br, and I.

37. A field-effect transistor type light-emitting device according to claim 29, characterized in that said inorganic semiconductor material contains a group III-V compound, or N and at least one element selected from Al, Ga, and In.

38. A field-effect transistor type light-emitting device according to claim 1, characterized in that said inorganic semiconductor material contains, as a main component, carbon forming an sp3 hybrid orbital.

39. A field-effect transistor type light-emitting device according to claim 38, characterized in that said inorganic semiconductor material is diamond.

40. A field-effect transistor type light-emitting device according to claim 1, characterized in that said inorganic semiconductor material is diamond.

41. A field-effect transistor type light-emitting device according to claim 1, characterized in that said inorganic semiconductor material contains a group II-VI compound, or Zn and at least one element selected from S, Se, and Te.

42. A field-effect transistor type light-emitting device according to claim 41, characterized in that said inorganic semiconductor material further contains Mn as dopants that form luminescence centers.

43. A field-effect transistor type light-emitting device according to claim 41, characterized in that said inorganic semiconductor material further contains, as dopants that form luminescence centers, at least one element among rare earth elements, or at least one element among Tm, Tb, Pr, and Sm.

44. A field-effect transistor type light-emitting device according to claim 41, characterized in that said inorganic semiconductor material further contains, as dopants that form luminescence centers, at least one metal element, or at least one element among Cu, Ag, Au, Al, Ga, In, Cl, F, Br, and I.

45. A field-effect transistor type light-emitting device according to claim 41, characterized in that said inorganic semiconductor material further contains, as dopants that form luminescence centers, at least one element among Cu, Ag, and Au, and at least one element among Al, Ga, In, Cl, F, Br, and I.

46. A field-effect transistor type light-emitting device according to claim 1, characterized in that said inorganic semiconductor material contains a group III-V compound, or N and at least one element selected from Al, Ga, and In.

47. A field-effect transistor type light-emitting device according to claim 1, characterized in that said inorganic semiconductor material contains, as a main component, carbon forming an sp3 hybrid orbital.

48. A field-effect transistor type light-emitting device according to claim 1, characterized in that said inorganic semiconductor material is diamond.

49. A field-effect transistor type light-emitting device according to claim 1, characterized in that said inorganic semiconductor material contains a group II-VI compound, or Zn and at least one element selected from S, Se, and Te.

50. A field-effect transistor type light-emitting device according to claim 49, characterized in that said inorganic semiconductor material further contains Mn as dopants that form luminescence centers.

51. A field-effect transistor type light-emitting device according to claim 49, characterized in that said inorganic semiconductor material further contains, as dopants that form luminescence centers, at least one element among rare earth elements, or at least one element among Tm, Tb, Pr, and Sm.

52. A field-effect transistor type light-emitting device according to claim 49, characterized in that said inorganic semiconductor material further contains, as dopants that form luminescence centers, at least one metal element, or at least one element among Cu, Ag, Au, Al, Ga, In, Cl, F, Br, and I.

53. A field-effect transistor type light-emitting device according to claim 49, characterized in that said inorganic semiconductor material further contains, as dopants that form luminescence centers, at least one element among Cu, Ag, and Au, and at least one element among Al, Ga, In, Cl, F, Br, and I.

54. A field-effect transistor type light-emitting device according to claim 1, characterized in that said inorganic semiconductor material contains a group III-V compound, or N and at least one element selected from Al, Ga, and In.

* * * * *